United States Patent [19]

Bu-Abbud

[11] Patent Number: 5,022,752
[45] Date of Patent: Jun. 11, 1991

[54] ECHO CANCELLING CIRCUIT FOR USE WITH LASER

[75] Inventor: George Bu-Abbud, Plano, Tex.

[73] Assignee: Reliance Comm/Tec Corporation, Chicago, Ill.

[21] Appl. No.: 411,727

[22] Filed: Sep. 25, 1989

[51] Int. Cl.⁵ ............................................. G01N 21/88
[52] U.S. Cl. ...................................... 356/73.1; 372/33
[58] Field of Search ................... 356/73.1; 250/205; 372/31, 33, 38

[56] References Cited

U.S. PATENT DOCUMENTS

| | | | |
|---|---|---|---|
| 4,243,320 | 1/1981 | Gordon | 356/73.1 |
| 4,355,395 | 10/1982 | Salter et al. | 372/38 |
| 4,838,689 | 6/1989 | Neumann | 356/73.1 |
| 4,893,006 | 1/1990 | Wakai et al. | 356/73.1 |
| 4,912,717 | 3/1990 | Takeuchi | 372/38 |

Primary Examiner—James W. Davie
Attorney, Agent, or Firm—Michael M. Rickin

[57] ABSTRACT

An echo cancelling circuit for use with a laser whose generated light is connected to an optical fiber by a connector. The connector reflects part of the laser light to a detector associated with the laser. The echo cancelling circuit attenuates the laser generated light by a predetermined factor. The cancelling circuit then detects the attenuated laser light and develops a signal whose amplitude and phase is such as to substantially cancel the signal representative of the light reflected from the connector.

13 Claims, 2 Drawing Sheets

ECHO CANCELLING CIRCUIT FOR USE WITH LASER

BACKGROUND OF THE INVENTION

1. Field of the Invention

This invention relates to light sources such as lasers which are used with optical fiber and more particularly to a circuit which cancels the echo that arises when the laser is connected to the fiber by a connector.

2. Description of the Prior Art

In my U.S. patent application Ser. No. 07/264,356 entitled "Power Control System For Laser" which was filed on Oct. 31, 1988 and is assigned to the same assignee as is the present invention (hereinafter "the U.S. patent application Ser. No. 07/264,356"), U.S. Pat. No. 4,958,926, there is described a power control system for a laser which may be used in an optical time domain reflectometer (OTDR). As described in the U.S. patent application Ser. No. 07/264,356 a laser module is directly connected to the optical fiber to be monitored by a coupler. The OTDR sends a pulse of light into the fiber and uses the backscattered light to determine the location of any faults on the fiber. The power control system described in the U.S. patent application Ser. No. 07/264,356 allows the OTDR to automatically compensate for changes in laser characteristics, and to automatically and accurately provide the location of the fault. The system accomplishes the latter result by controlling the bias and pulse currents into the laser and also by ensuring that the electrical signal representative of the backscattered light is controlled to have a certain amplitude range.

The OTDR described in the U.S. patent application Ser. No. 07/264,356 may be connected to the fiber through a connector, i.e. the coupler rather that being directly connected to the fiber is connected to the fiber through a connector. While the use of a connector allows for easy removal of the OTDR from the fiber, it may present a problem as the light reflected from the connector (also sometimes referred to as an echo) can have an intensity which is from 20 to 200 times the intensity of the backscattered light. The electrical signal representative of that light would then saturate the electronics associated with the detector of the control system and the electronics would not "see" the backscattered light.

One solution to the saturation problem described above is to use analog switches after the detector to blank the high amplitude signal arising from the connector reflected light. The use of such switches adds noise, which has a detrimental effect on the operation of the OTDR. The noise is due to the bias currents, stray capacitances etc. associated with the switches. Alternatively, either acoustic or electro-optic masking can be used just before the detector. Such masking involves the use of undesirable very high voltages and radio frequency modulation and adds several thousand dollars to the cost of manufacturing the OTDR. Therefore, predetector masking while solving the saturation problem introduces other undesirable factors which must be taken into account in the design of the OTDR.

Of course, the gain of the electronics associated with the detector can always be made smaller so that the reflected light from the connector does not saturate the electronics. While the reduction in gain solves the saturation problem it also causes the electrical signal representative of the backscattered light from the fiber to be so low in amplitude that it is very hard to distinguish from noise. In other words, a reduction in gain sufficient to solve the saturation problem makes the OTDR unusable for its intended purpose.

It is desirable that the solution to the saturation arising from the light reflected from the connector does not detrimentally affect the operation of the OTDR. It is also desirable that the solution not involve the use of high voltages and radio frequency modulation. It is further desirable that the solution not add substantially to the cost of manufacturing the OTDR. The circuit of the present invention meets the above requirements.

SUMMARY OF THE INVENTION

An echo cancelling circuit for connection to an instrument. The instrument includes a source for generating light and a connector for connecting the light to an optical fiber. The connector reflects with a known intensity some of the light generated by the source. The instrument also includes a first means which responds to the known intensity light reflected by the connector to generate an electrical signal which occurs at a predetermined time after the source generates light. The amplitude of the electrical signal is related to the known intensity.

The echo cancelling circuit includes attenuating and delay means which responds to the light generated by the source when the echo cancelling circuit is connected to the instrument for providing at the predetermined time light whose intensity is substantially equal to the known intensity. The circuit also includes second means which responds to the light provided by the attenuating and delay means for generating an electrical signal whose amplitude is related to the provided light intensity. The electrical signal generated by the second means is provided in phase opposition to the first means generated electrical signal when the echo cancelling circuit is connected to the instrument.

DESCRIPTION OF THE PREFERRED EMBODIMENT

Figure 1:
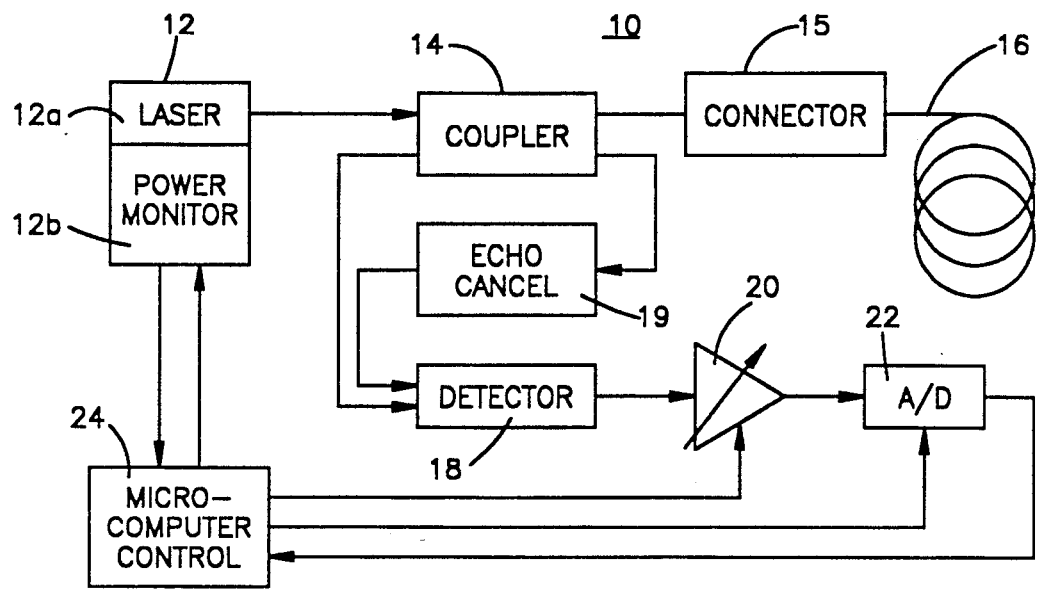
FIG. 1 is a block diagram of an OTDR in which the echo cancelling circuit of the present invention may be used.

Referring now to FIG. 1, there is shown a block diagram of an OTDR 10 in which the echo cancelling circuit 19 of the present invention may be used. Except as described hereinafter, OTDR 10 is identical to the OTDR described in the U.S. patent application Ser. No. 07/264,356 and the same reference numerals are used in FIG. 1 of this application as are used in FIG. 1 of that application to identify identical components.

OTDR 10 includes a laser circuit 12 which comprises a laser module 12a and a power monitor 12b. The laser module 12a is connected through 3 dB coupler 14 and connector 15 to the optical fiber 16 to be monitored. The power monitor 12b provides both the bias current for the laser module 12a and the current to be pulsed through the laser module when it is desired to transmit light on fiber 16. As described in the U.S. patent application Ser. No. 07/264,356, monitor 12b includes means to monitor both the average power and peak power out of laser module 12a to thereby advantageously control the operation of module 12a.

OTDR 10 sends a pulse of light into fiber 16. The backscattered light from fiber 16 is received through connector 15 at coupler 14. That backscattered light is passed to detector 18. As described in the U.S. patent application Ser. No. 07/264,356, the combination of detector 18, gain and offset circuit 20, A/D converter circuit 22 and microcomputer control circuit 24 is responsive to the light backscattered from fiber 16 to provide a waveform representative of backscattered light intensity versus time. That waveform is used by a technician to find the location of a fault on the fiber.

The pulse of light sent by OTDR 10 into fiber 16 is reflected from connector 15. That reflected light is also received at coupler 14 and passed to detector 18. It is that light which, because of its very high intensity as compared to the backscattered light intensity, causes the electronics associated with detector 18 to saturate. In accordance with the present invention, OTDR 10 also includes echo cancelling circuit 19 which functions in the manner to be described hereinafter to essentially cancel all of the connector reflected light at the input to the detector. Circuit 19 is connected between coupler 14 and detector 18.

Figure 2:
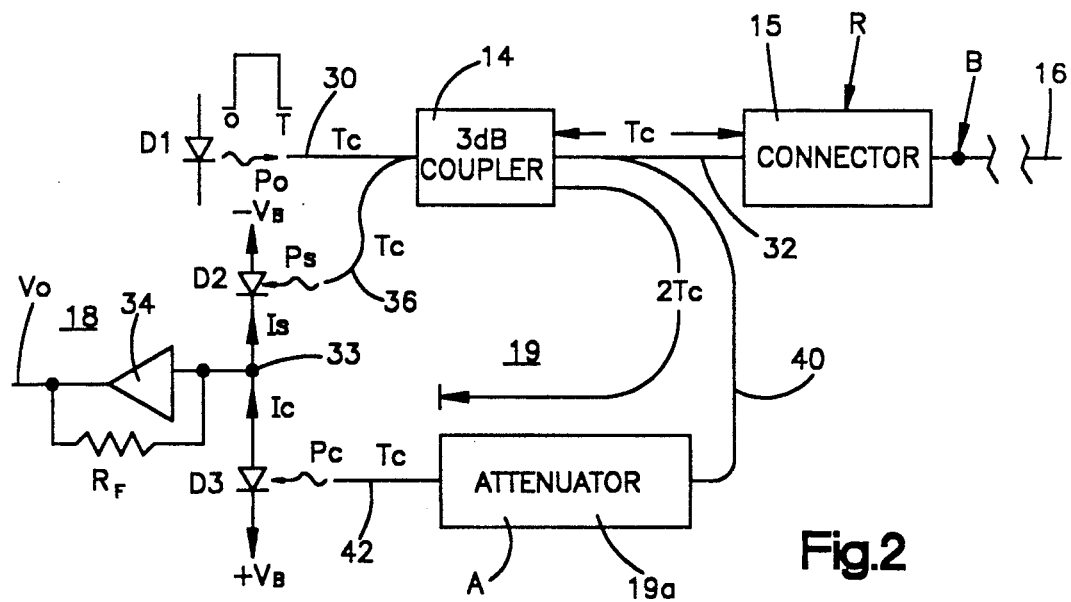
FIG. 2 is a simplified schematic and block diagram for a part of the OTDR shown in FIG. 1 and in particular the echo cancelling circuit.

Referring now to FIG. 2 there is shown a simplified schematic and block diagram for laser module 12a, coupler 14, connector 15, detector 18 and echo cancelling circuit 19. Laser module 12a which is shown in the form of a diode D1 generates a pulse of light having a width of T when it is desired to transmit light on fiber 16. The pulse of light from diode D1 enters one end of an optical fiber 30, the other end of which is connected to the input of coupler 14.

The speed of propagation of light on an optical fiber is known. In accordance with the present invention, the length of fiber 30 is selected so that it takes a predetermined amount of time, Tc, for the pulse of light to propagate along the fiber from the diode to the coupler. The time Tc is selected to be very small as compared to the laser pulse width T.

The coupler is connected to connector 15 by an optical fiber 32. In accordance with the present invention, the length of fiber 32 is selected so that it also takes the time, Tc, for the light pulse to propagate along fiber 32 from the coupler to the connector. Therefore, the pulse of light from diode D1 reaches the beginning of fiber 16 at the time 2 Tc, after it was generated.

Detector 18 includes diode D2 which has its anode connected to a source of voltage and its cathode connected to a node 33. Coupler 14 is connected to diode D2 by an optical fiber 36 which in accordance with the present invention is selected to have a length such that it also takes the time Tc, for the backscattered light to propagate along the fiber from the coupler to the diode. The backscattered light from fiber 16 propagates along fiber 32 to coupler 14 and then along fiber 36 to diode D2, which functions to convert that backscattered light into an analog electrical signal.

As described above, when laser module 12a generates a pulse of light, part of that light is reflected from connector 15. That reflected light also appears at diode D2. As fibers 30, 32 and 36 are each selected to have a propagation time of Tc, the reflected light appears at diode D2 at the time 4 Tc after laser module 12a has generated the pulse. The diode converts that reflected light into an analog electrical signal.

Also as described above, it takes a pulse of light from diode D1 the time of 2 Tc to reach the beginning of fiber 16. As that pulse propagates along fiber 16 each discrete point on that fiber backscatters light to the OTDR. The first backscattered light also appears at diode D2 at the same time (4 Tc after laser module 12a has generated the pulse) that the reflected light appears at the diode. In fact, the reflected light will appear at the diode just before the backscattered light does as the backscattered light must propagate through the connector.

The power of the backscattered light at the beginning of fiber 16 and the reflected light at connector 15 have been measured in an OTDR embodied as shown in FIG. 2. The power of the backscattered light at the beginning of fiber 16 was approximately −53 dB while the power of the reflected light at the connector was approximately −40 dB. Both measurements are in reference to the power of light into fiber 16. As the reflected light and the backscattered light are attenuated by essentially the same amount as they propagate along fibers 32 and 36 and through coupler 14 before reaching diode D2, it is clear from the above measurements that the reflected light will drive the electronics after the detector, i.e. circuit 20, into saturation making it very hard for the OTDR to detect the backscattered light. In that same OTDR the width of the laser pulse was one microsecond and the time Tc was 10 nanoseconds.

OTDR 10 includes echo cancelling circuit 19 which has an adjustable attenuator 19a connected to coupler 14 by an optical fiber 40. In accordance with the present invention the length of fiber 40 is selected so that it takes the laser light pulse the time of 2 Tc to propagate from the coupler to and through the attenuator 19a. That is, the time 2 Tc is the sum of the time for the light pulse to propagate through the fiber 40 and through the attenuator. No light is reflected from the attenuator.

Circuit 19 includes a diode D3 which has its cathode connected to a source of positive voltage and its anode connected to node 33. Attenuator 19a is connected to diode D3 by an optical fiber 42 whose length, in accordance with the present invention, is selected so that it takes the attenuated light pulse the time of Tc to propagate from the attenuator to the diode. Therefore, at the time 4 Tc after diode D1 has generated a light pulse, an attenuated light pulse appears at diode D3. Diode D3 functions to convert that attenuated light pulse into an analog electrical signal.

The analog electrical signal representative of the light reflected from connector 15 and the analog electrical signal representative of the attenuated light pulse both appear at node 33. More specifically a current $I_s$ flows through diode D2 away from node 33, while a current $I_c$ flows through diode D3 towards node 33. The node is connected to the input of an amplifier 34 which as described in the U.S. patent application Ser. No. 07/264,356 functions to provide a fixed gain to the signal at its input.

The voltage signal at the output of amplifier 34 is the difference between the currents $I_s$ and $I_c$ multiplied by the resistance of resistor $R_F$. In order to cancel the voltage at the output of the amplifier that results from the light reflected from the connector, it is necessary that the current $I_s$ that flows as a result of the reflected light be equal in amplitude to the current $I_c$ that flows as a result of the attenuated light pulse. Therefore, by properly adjusting attenuator 19a the reflected light from the connector can be substantially cancelled at detector 18.

The operation of echo cancelling circuit 19 will now be described in greater detail. The light pulse emitted by laser diode D1 has the width T, which is as described above many times greater than the time Tc. In the description below the power output of the laser diode is designated as $P_o$, the reflected power from connector 15 is designated as R, the backscattered power at the connection of fiber 16 to connector 15 is designated as B, the attenuation in power provided by the combination of fiber 40 and attenuator 19a is designated as A, the power of the light available at diode D2, i.e. at the end of fiber 36 adjacent to the diode, is designated as $P_s$ and the power of the light available at diode D3, i.e. at the end of fiber 42 adjacent to the diode, is designated as $P_c$. All powers are expressed in dB.

At a time t which is less than the sum of duration of the laser light pulse and 2 Tc, i.e. $t < T + 2$ Tc, the power $P_s$ is:

$$P_s = P_o - 6dB - 10 log(10^{R/10} + 10^{B/10}) \qquad (1)$$

The coupler 14 has a power attenuation of 3 dB to light passing through it. In the time t the laser light pulse passes through the coupler to the fiber and then the reflected and backscattered light both pass through the coupler in the opposite direction towards the diode D2. The total power attenuation provided by the coupler is 6 dB.

For the same time t, the power $P_c$ is:

$$P_c = P_o - 3dB - A \qquad (2)$$

During the time t the laser light pulse has passed through the coupler and has been attenuated in power by 3dB when it appears at the end of fiber 40 connected to the fiber 16. It is further attenuated in power by A as it propagates along fiber 40 and through the attenuator.

As described above, a current $I_s$ flows through diode D2 away from node 33 as a result of the light from fiber 36 shining on the diode and a current $I_c$ flows through D3 towards node 33 as a result of the light from fiber 42 shining on the diode. Also as described above the output voltage at the output of amplifier 34 will be cancelled if the two currents $I_s$ and $I_c$ are made equal to each other in amplitude. That cancellation should occur at the time t as it takes the laser light pulse 2 Tc to propagate from diode D1 to the beginning of fiber 16.

As is well known the current $I_s$ is equal to antilogarithm of the power $P_s$ multiplied by a constant. The current $I_c$ is equal to the logarithm of the power $P_c$ multiplied by the same constant. Therefore, in order for cancellation of the output voltage from amplifier 34 to occur at time t, $P_s$ must be equal to $P_c$. That requirement of equality allows the equations given above for $P_c$ and $P_s$ to be solved for the amount of reflected power attenuation, A, as:

$$A = 10 log(10^{R/10} + 10^{B/10}) + 3dB \qquad (3)$$

As the reflected power is substantially greater than the backscattered power at time t the backscattered power can be ignored in the above equation. The amount of attenuation, A, needed to provide cancellation at time $t < T + 2$ Tc is then approximately:

$$R + 3 dB \qquad (4)$$

which for the measured power of the reflected light in the OTDR embodied as shown in FIG. 2, requires that A be about 46 dB in that OTDR in order to provide the desired cancellation.

As will be described below, the attenuation provided by circuit 19 also has a beneficial effect on the operation of the OTDR for a time which is after the laser light reflected by connector 15 has ended. In that description it is assumed that amplifier 34 has a rise and fall time which are each both the same as the width of the laser light pulse, i.e. T. Therefore, the operation of the OTDR will be described for a time t which is after twice the duration of the laser diode pulse, i.e., $t > 2$ T.

At that time the power $P_s$ is:

$$P_s = P_o - 6dB - B \qquad (5)$$

and the power $P_c$ is:

$$P_c = P_o - 6dB - B - R_s - A \qquad (6)$$

where $R_s$ is the small amount of power reflected at diode D2. As the power $R_s$ is so small it will be ignored hereinafter.

A comparison of equations 5 and 6 above shows that at the time $t > 2$ T the power $P_s$ is greater than the power $P_c$ by A. While it has been assumed that the reflected power $R_s$ was very small it should be appreciated that even if there was a 100% reflection at diode D2, i.e. $R_s$ equals 0 dB, the power $P_c$ would still be very small as compared to the power $P_s$.

Figure 3:
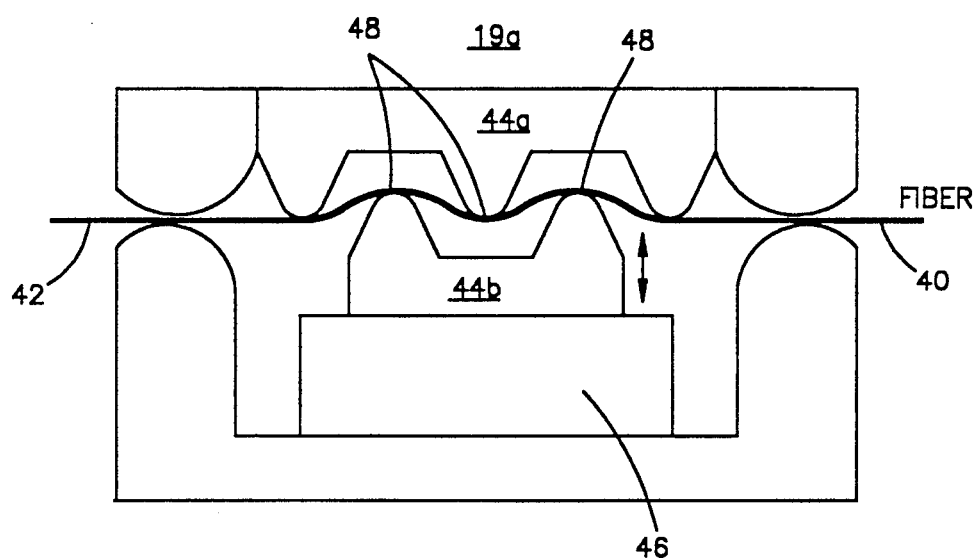
FIG. 3 shows one embodiment for the attenuator included in the echo cancelling circuit.

Attenuator 19a may be embodied (as shown in FIG. 3) by two sets of cylindrical fingers 46a, 44b, with each set having a multiplicity of fingers. For ease of illustration only three fingers are shown in set 44a and only two fingers are shown in set 44b. One set 44a of fingers is fixed and the other set 44b is mounted on a movable platform 46. The fiber is passed between the two sets of fingers. Moving the movable fingers relative to the fixed fingers causes a number of loops or bends 48 to occur in the fiber. Each loop causes some of the transmitted light on the fiber to radiate out of the fiber without reflection. Adjustment of the movable fingers relative to the fixed fingers changes the size of the loop and therefore changes the amount of attenuation provided by circuit 19a.

It should be appreciated that attenuator 19a can be adjusted so that it overcompensates, i.e. provides more attenuation than needed. In this manner, the circuit of the present invention will provide the desired cancellation without further adjustment even if connector 15 should be changed after installation of OTDR 10. Attenuator 19a may also be servoed to automatically adjust for different connectors.

It is to be understood that the description of the preferred embodiment is intended to be only illustrative, rather than exhaustive, of the present invention. Those of ordinary skill will be able to make certain additions, deletions and/or modifications to the embodiment of the disclosed subject matter without departing from the spirit of the invention or its scope as defined by the appended claims.

What is claimed is:

1. An echo cancelling circuit for connection to an instrument, said instrument including source means for generating light, means for connecting said source means generated light to an optical fiber, said connecting means reflecting with a known intensity some of said source means generated light, and first means responsive to said known intensity connecting means reflected light for generating an electrical signal occurring at a predetermined time after said source means generates light and having an amplitude related to said known intensity, said echo cancelling circuit comprising:

a) attenuating and delay means responsive to said source means generated light when said echo cancelling circuit is connected to said instrument for providing at said predetermined time light having an intensity which is substantially equal to said known intensity; and b) second means responsive to said attenuating and delay means provided light for generating an electrical signal having an amplitude related to said attenuating and delay means provided light intensity, said second means generated electrical signal provided in phase opposition to said first means generated electrical signal when said echo cancelling circuit is connected to said instrument to thereby substantially cancel said first means generated electrical signal.

2. The echo cancelling circuit of claim 1 wherein said second means comprises a means for detecting said attenuating and delay means provided light.

3. The echo cancelling circuit of claim 2 wherein said detecting means is a semiconductor device.

4. The echo cancelling circuit of claim 1 wherein said instrument further includes:

means having a first propagation time for coupling said source means generated light to said connecting means, a second propagation time for coupling said source means generated light to said echo cancelling circuit attenuating and delay means and a third propagation time for coupling said connecting means reflected source means generated light to said first means; and said echo cancelling circuit transmitting and delay means having a fourth propagation time for coupling said attenuating and delay means provided light to said second means, the sum of said first and third propagation times being equal to the sum of said second and fourth propagation times.

5. An optical instrument comprising:
a) source means for generating a pulse of light;
b) a connector for connecting said source means light pulse to an optical fiber, said connector reflecting with a known intensity part of said light pulse;
c) means for detecting said light pulse part reflected by said connector and generating an electrical signal having an amplitude related to said known intensity, said electrical signal occurring at a predetermined time after said source means generates said light pulse; and
d) echo cancelling means responsive to said source means light pulse for generating at said predetermined time an electrical signal having an amplitude which is substantially equal to said amplitude of said detecting means generated electrical signal and providing said echo cancelling means generated electrical signal in phase opposition to said detecting means generated electrical signal to thereby substantially cancel said detecting means generated electrical signal.

6. The optical instrument of claim 5 wherein said echo cancelling means comprises:

i) light attenuating and delay means responsive to said source means light pulse for providing at said predetermined time a light pulse having an intensity substantially equal to said known intensity of said connector reflected light pulse part; and ii) means responsive to said light attenuating and delay means provided light pulse for generating at said predetermined time said substantially equal amplitude electrical signal and providing said substantially equal amplitude electrical signal in phase opposition to said detecting means generated electrical signal.

7. The optical instrument of claim 6 wherein said means responsive to said light attenuating and delay means light pulse includes means for detecting said light attenuating and delay means light pulse and generating at said predetermined time said substantially equal amplitude electrical signal.

8. The optical instrument of claim 6 wherein said provided light responsive means includes means for detecting said provided light and generating at said predetermined time said substantially equal amplitude electrical signal.

9. The instrument of claim 6 further comprising:

e) means having a first propagation time for coupling said source means generated pulse of light to said connector, a second propagation time for coupling said source means generated pulse of light to said echo cancelling means light attenuating and delay means and a third propagation time for coupling said connector reflected light pulse part to said detecting means; and wherein said echo cancelling means light attenuating and delay means has a fourth propagation time for coupling said attenuating and delay means provided light pulse to said means responsive to said attenuating and delay means light pulse, the sum of said first and third propagation times being equal to the sum of said second and fourth propagation times.

10. An echo cancelling circuit for an instrument, said instrument including source means for generating light, means for connecting said source means generated light to an optical fiber, said connecting means reflecting with a known intensity some of said source means generated light, and first means responsive to said known intensity connecting means reflected light for generating an electrical signal occurring at a predetermined time after said source means generates light and having an amplitude related to said known intensity, said echo cancelling circuit comprising:

a) an input for connection to said source means;
b) attenuating and delay means responsive to said source means generated light at said input for providing at said predetermined time light having an intensity which is substantially equal to said known intensity; and
c) second means responsive to said attenuating and delay means provided light for generating an electrical signal having an amplitude related to said attenuating and delay means provided light intensity, said second means having an output for connection to said first means in a manner such that said second means generated electrical signal is in phase opposition to said first means generated electrical signal.

11. The echo cancelling circuit of claim 10 wherein said instrument further includes:
   means having a first propagation time for coupling said source means generated light to said connecting means, a second propagation time for coupling said source means generated light to said echo cancelling circuit attenuating and delay means input and third propagation time for coupling said connecting means reflected source means generated light to said first means; and
   said echo cancelling circuit attenuating and delay means having a fourth propagation time for coupling said attenuating and delay means provided light to said second means,
   the sum of said first and third propagation times being equal to the sum of said second and fourth propagation times.

12. The echo cancelling circuit of claim 10 wherein said second means comprises a means for detecting said attenuating and delay means provided light.

13. The echo cancelling circuit of claim 12 wherein said detecting means is a semiconductor device.

* * * * *